(12) United States Patent
Guillorn et al.

(10) Patent No.: US 9,059,096 B2
(45) Date of Patent: Jun. 16, 2015

(54) METHOD TO FORM SILICIDE CONTACT IN TRENCHES

(75) Inventors: Michael A. Guillorn, Yorktown Heights, NY (US); Christian Lavoie, Pleasantville, NY (US); Ghavam G. Shahidi, Pound Ridge, NY (US); Bin Yang, San Carlos, CA (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/356,090

(22) Filed: Jan. 23, 2012

(65) Prior Publication Data

US 2013/0187171 A1 Jul. 25, 2013

(51) Int. Cl.
*H01L 23/62* (2006.01)
*H01L 21/285* (2006.01)
*H01L 21/8238* (2006.01)
*H01L 29/417* (2006.01)
*H01L 29/66* (2006.01)
*H01L 29/45* (2006.01)
*H01L 29/786* (2006.01)
*H01L 23/485* (2006.01)
*H01L 21/768* (2006.01)

(52) U.S. Cl.
CPC .. *H01L 21/28518* (2013.01); *H01L 21/823814* (2013.01); *H01L 21/823871* (2013.01); *H01L 29/41725* (2013.01); *H01L 29/41775* (2013.01); *H01L 29/6659* (2013.01); *H01L 29/41733* (2013.01); *H01L 29/458* (2013.01); *H01L 29/66772* (2013.01); *H01L 29/78621* (2013.01); *H01L 23/485* (2013.01); *H01L 21/76846* (2013.01); *H01L 21/76855* (2013.01); *H01L 2924/0002* (2013.01)

(58) Field of Classification Search
CPC ............ H01L 21/28061; H01L 29/665; H01L 21/28052
USPC ........................................................ 257/288
See application file for complete search history.

(56) References Cited

U.S. PATENT DOCUMENTS

| | | | |
|---|---|---|---|
| 6,372,566 B1 | 4/2002 | Kittl et al. | |
| 6,511,905 B1 * | 1/2003 | Lee et al. | ........................ 438/629 |
| 6,624,088 B2 * | 9/2003 | Moore | ........................... 438/756 |
| 6,858,487 B2 | 2/2005 | Yang et al. | |
| 6,960,525 B2 | 11/2005 | Chen et al. | |

(Continued)

OTHER PUBLICATIONS

Non-Final Office Action dated Dec. 28, 2012 for U.S. Appl. No. 13/614,812.

(Continued)

*Primary Examiner* — Jack Chen
(74) *Attorney, Agent, or Firm* — Fleit Gibbons Gutman Bongini & Bianco PL; Thomas Grzesik

(57) ABSTRACT

A method for forming silicide contacts includes forming a dielectric layer on a gate spacer, a gate stack, and a first semiconductor layer. The first semiconductor layer comprises source/drain regions. Contact trenches are formed in the dielectric layer so as to expose at least a portion of the source/drain regions. A second semiconductor layer is formed within the contact trenches. A metallic layer is formed on the second semiconductor layer. An anneal is performed to form a silicide region between the second semiconductor layer and the metallic layer. A conductive contact layer is formed on the metallic layer or the silicide region.

13 Claims, 6 Drawing Sheets

(56) References Cited

U.S. PATENT DOCUMENTS

| | | |
|---|---|---|
| 7,189,648 B2 | 3/2007 | Lander et al. |
| 7,598,545 B2 | 10/2009 | Cartier et al. |
| 7,666,762 B2 | 2/2010 | Jeon et al. |
| 7,897,513 B2 | 3/2011 | Bu et al. |
| 2006/0246720 A1 | 11/2006 | Wu et al. |
| 2007/0141798 A1 | 6/2007 | Bohr |
| 2010/0052166 A1* | 3/2010 | Mukherjee et al. ........... 257/741 |

OTHER PUBLICATIONS

Final Office Action dated Apr. 16, 2013 for U.S. Appl. No. 13/614,812.
Non Final Office Action dated Aug. 6, 2013 for U.S Appl. No. 13/614,812.
Final Office Action dated Oct. 25, 2013 for U.S. Appl. No. 13/614,812.
Non Final Office Action dated Apr. 4, 2014 received for U.S. Appl. No. 13/614,812.

* cited by examiner

METHOD TO FORM SILICIDE CONTACT IN TRENCHES

FIELD OF THE INVENTION

The present invention generally relates to the field of semiconductors, and more particularly relates to forming silicide contacts for a semiconductor device.

BACKGROUND OF THE INVENTION

Silicide contacts are of specific importance to integrated circuits, including those having complementary metal oxide semiconductor (CMOS) devices, because of the need to reduce the electrical resistance of the contacts (particularly at the source/drain and gate regions) in order to increase chip performance. Silicides are metal compounds that are thermally stable and provide for low electrical resistivity at the silicon/metal interface. Reducing contact resistance improves device speed, therefore increasing device performance.

SUMMARY OF THE INVENTION

In one embodiment, a method for forming silicide contacts is disclosed. The method comprises forming a dielectric layer on a gate spacer, a gate stack, and a first semiconductor layer. The semiconductor layer comprises source/drain regions. Contact trenches are formed in the dielectric layer so as to expose at least a portion of the source/drain regions. A second semiconductor layer is deposited/formed within the contact trenches. A metallic layer is deposited/formed on the second semiconductor layer for formation of a silicide layer/region. A conductive contact layer is formed/formed on the metallic or silicide layer/region to fill the contact trenches. These layers outside the contact trenches are mechanically removed.

In another embodiment, a transistor is disclosed. The transistor comprises a dielectric layer formed on a first semiconductor layer, a gate spacer, and a gate stack. The gate spacer and gate stack are formed on the first semiconductor layer. A first contact region and a second contact region are formed on at least a portion of source/drain regions, respectively, within the first semiconductor layer. Each of the first contact region and second contact region comprises a second semiconductor layer formed within the respective first contact region and a second contact region. A metallic layer is formed on the second semiconductor layer for formation of a silicide layer/region. A conductive contact layer is formed on the metallic or silicide layer/region.

In yet another embodiment, an integrated circuit is disclosed. The integrated circuit comprises a transistor. The transistor comprises a dielectric layer formed on a first semiconductor layer, a gate spacer, and a gate stack. The gate spacer and gate stack are formed on the first semiconductor layer. A first contact region and a second contact region are formed on at least a portion of source/drain regions, respectively, within the first semiconductor layer. Each of the first contact region and second contact region comprises a second semiconductor layer formed within the respective first contact region and a second contact region. A metallic layer is formed on the second semiconductor layer for formation of a silicide layer/region. A conductive contact layer is formed on the metallic or silicide layer/region.

In a further embodiment, an electronic device is disclosed. The electronic device comprises an integrated circuit. The integrated circuit comprises a semiconductor layer. The integrated circuit comprises a transistor. The transistor comprises a dielectric layer formed on a first semiconductor layer, a gate spacer, and a gate stack. The gate spacer and gate stack are formed on the first semiconductor layer. A first contact region and a second contact region are formed on at least a portion of source/drain regions, respectively, within the first semiconductor layer. Each of the first contact region and second contact region comprises a second semiconductor layer formed within the respective first contact region and a second contact region. A metallic layer is formed on the second semiconductor layer for formation of a silicide layer/region. A conductive contact layer is formed on the metallic or silicide layer/region.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
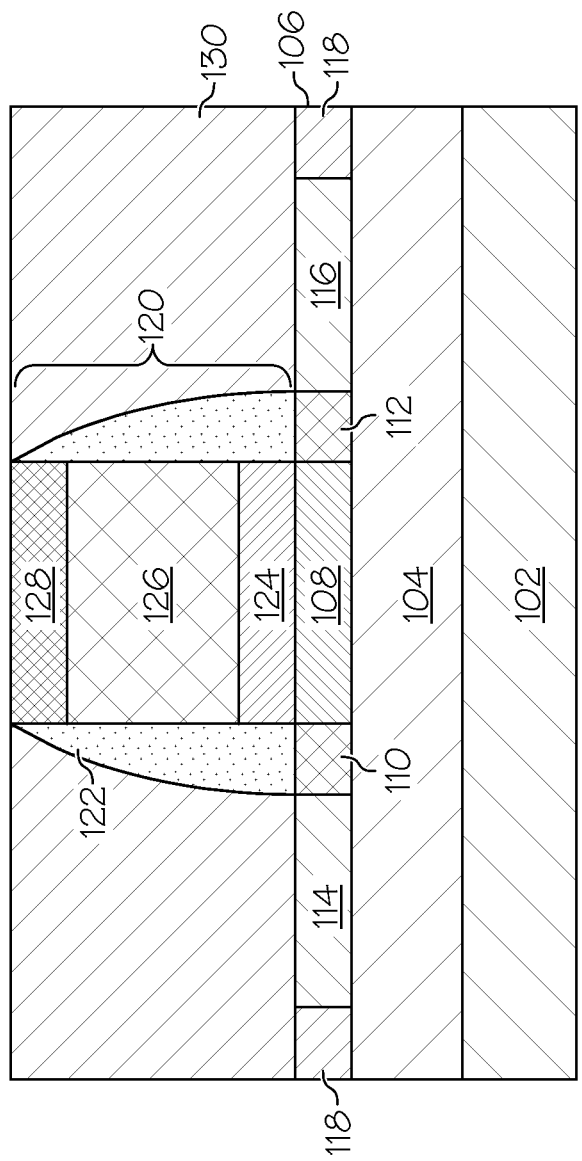
FIG. 1 is a cross-sectional view of a semiconductor structure after a dielectric layer has been formed on a semiconductor substrate according to one embodiment of the present invention.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

As discussed above, silicide contacts are of specific importance to integrated circuits. However, most conventional processes for forming silicide contacts experience a certain amount of consumption of the substrate during silicide formation. In conventional transistors, nickel and its alloys are commonly used for silicides, where nickel to silicon consumption ratio is, for example, approximately 1.8. Such consumption can be a serious issue when the substrate material is limited. One example is the thin silicon-on-insulator (SOI) device. Another drawback of conventional processes is that selectively etching excessive silicide can be challenging for various metals. Therefore, one or more embodiments of the present invention forms contact regions that comprises a semiconductor layer formed within the contact regions. This semiconductor layer is formed on source/drain regions within the underlying semiconductor layer (active region). A metallic layer is formed on the second semiconductor layer. A conductive contact layer is formed on the metallic or silicide layer. By forming a semiconductor layer on the source/drain regions silicon from the underlying semiconductor layer is not consumed when silicide/germanide regions are formed. Another advantage is that band edge silicide/germanide is obtainable. A further advantage is that the silicide/contact integration process of various embodiments allows for silicide integration using rare earth materials.

FIGS. 1-5 illustrate an example of a process for forming silicide contacts for a semiconductor device according to one embodiment of the present invention. It should be noted that the following process discussed below is applicable to both nFET and pFET devices. It should also be noted that one or more embodiments of the present invention are applicable to both bulk substrate devices and SOI devices. As shown in FIG. 1, there is provided a handle substrate 102, a buried insulator layer (e.g., buried oxide (BOX)) 104, and a top semiconductor layer 106. The handle substrate 102 can be a semiconductor substrate comprising a single crystalline semiconductor material such as single crystalline silicon, a polycrystalline semiconductor material, an amorphous semiconductor material, or a stack thereof. The thickness of the handle substrate 102 can be, for example, from 50 microns to 1,000 microns, although lesser and greater thicknesses can also be employed. A buried insulator layer 104 includes a dielectric material such as silicon oxide, silicon nitride, silicon oxynitride, or any combination thereof.

The thickness of the buried insulator layer 104 can be, for example, form 50 nm to 500 nm, although lesser and greater thicknesses can also be employed. The thickness of the top semiconductor layer 106 can be, for example, from 3 nm to 80 nm, and typically from 5 nm to 10 nm, although lesser and greater thicknesses can also be employed. The top semiconductor layer 106 can comprise any semiconducting material, including but not limited to Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), GaSb (gallium antimonide), or any combination thereof, as well as other III/V or II/VI compound semiconductors and alloys thereof.

FIG. 1 shows that the top semiconductor layer 106 includes various single crystalline semiconductor portions, which can comprise, for example, a body/channel region 108, a source extension region 110, a drain extension region 112, a planar source region 114, and a planar drain region 116. Shallow trench isolation structures 118 can be formed in the top semiconductor layer 106 employing conventional fabrication methods. For example, the shallow trench isolation structures 118 can be formed by trenches extending from the top surface of the top semiconductor layer 106 at least to the top surface of the buried insulator layer 104, filling the trenches with a dielectric material, and removing excess dielectric material from above the top surface of the top semiconductor layer 106.

The various single crystalline semiconductor portions (108, 110, 112, 114, 116) in the top semiconductor layer 106 can be formed by introducing electrical dopants such as B, Ga, In, P, As, and/or Sb by ion implantation, plasma doping, and/or gas phase doping employing various masking structures as known in the art. Before implanting electrical dopants into various portions of the top semiconductor layer 106, a gate stack structure 120 and gate spacer 122 are formed. The gate stack 120 is formed on the semiconductor layer 106 over the body region 108. In one embodiment, the gate stack 120 comprises a gate dielectric 124 and a gate conductor 126. In the illustrated embodiment, a gate polysilicon cap 128 is deposited on the gate conductor layer 126, such as through LPCVD or silicon sputtering. It should be noted that instead of first forming the gate stack 120, a replacement (dummy) gate structure can be formed to act as a place holder for the gate stack, which is formed during a subsequent processing step.

The gate stack 120 can be formed by depositing a stack of a gate dielectric material and a gate conductor material on the top semiconductor layer 106. This stack is then patterned and etched to form the gate dielectric 124 and the overlying gate conductor 126 on a portion of the top semiconductor layer 106. The gate dielectric 124 of this embodiment is a conventional dielectric material (such as silicon oxide, silicon nitride, silicon oxynitride, or a stack thereof) that is formed by thermal conversion of a top portion of the active region and/or by chemical vapor deposition (CVD). In an alternative embodiment, the gate dielectric 124 is a high-k dielectric material (such as hafnium oxide, zirconium oxide, lanthanum oxide, aluminum oxide, titanium dioxide, strontium titanate, lanthanum aluminate, yttrium oxide, an alloy thereof, or a silicate thereof) that is formed by CVD, atomic layer deposition (ALD), molecular beam epitaxy (MBE), pulsed laser deposition (PLD), liquid source misted chemical deposition (LSMCD), or physical vapor deposition (PVD). Alternatively, the gate dielectric may comprise any suitable combination of those dielectric materials.

The gate conductor 126 is a semiconductor (e.g., polysilicon) gate layer and/or a metal gate layer. For example, the gate dielectric 124 can be a conventional dielectric material and the gate conductor 126 can be a semiconductor gate layer. Alternatively, the gate dielectric 124 can be a high-k dielectric material and the gate conductor 126 can be a metal gate layer of a conductive refractory metal nitride (such as tantalum nitride, titanium nitride, tungsten nitride, titanium aluminum nitride, triazacyclononane, or an alloy thereof). In a further embodiment, the gate conductor 126 comprises a stack of a metal gate layer and a semiconductor gate layer. The gate stack 120 can also include a work function metallic layer as well. In yet a further embodiment, the gate stack 120 can be formed atop an optional chemical oxide layer (not shown) (also referred to herein as an "interfacial layer"), which is formed on an exposed semiconductor surface of the body portion 108 of the top semiconductor layer 106.

The gate spacer 122 comprises a dielectric material (such as silicon oxide, silicon nitride, silicon oxynitride or any combination of these). The gate spacer 122 is formed on gate stack 120 and on a portion of the top semiconductor layer 106. In one embodiment, a reactive-ion etch process is used to remove the dielectric material on horizontal surfaces such as the top of the gate stack 120, the STI regions 118, and portions of the top semiconductor layer 106 to form a gate spacer only on the sidewall of the gate structure 106. However, the gate spacer material can be etched such that the gate spacer 122 also resides on top of the gate structure 106 as well.

Figure 2:
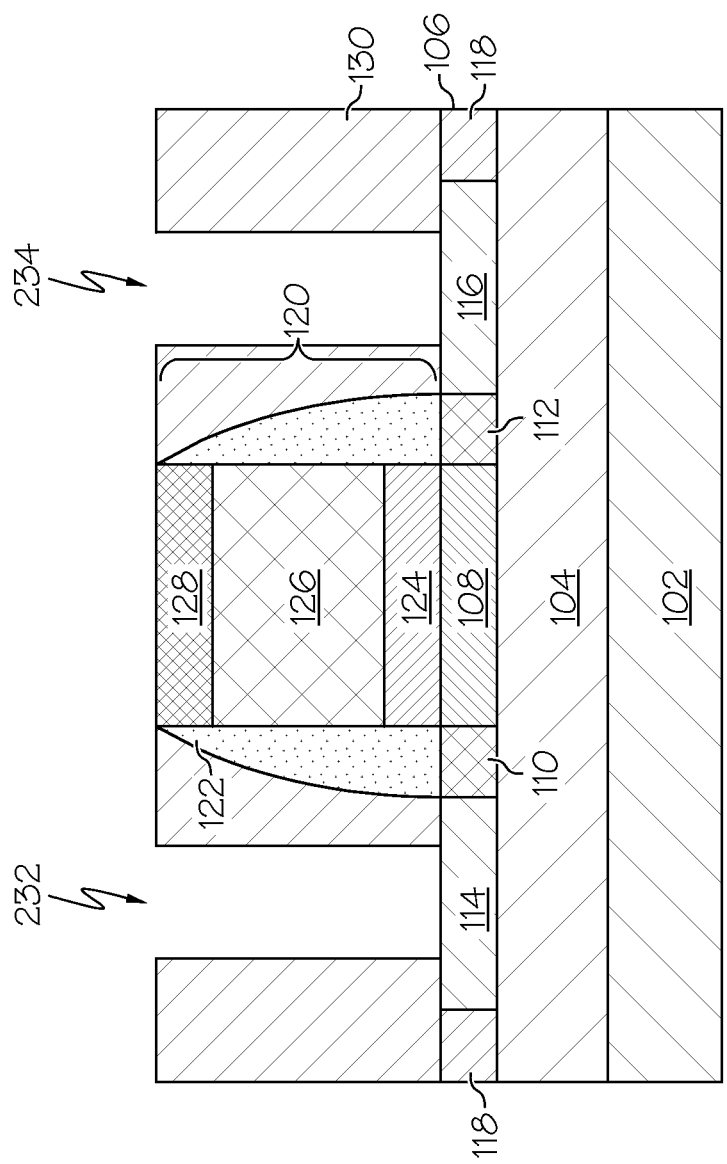
FIG. 2 is a cross-sectional view of the semiconductor structure after contact regions have been formed in the dielectric layer according to one embodiment of the present invention.
Figure 3:
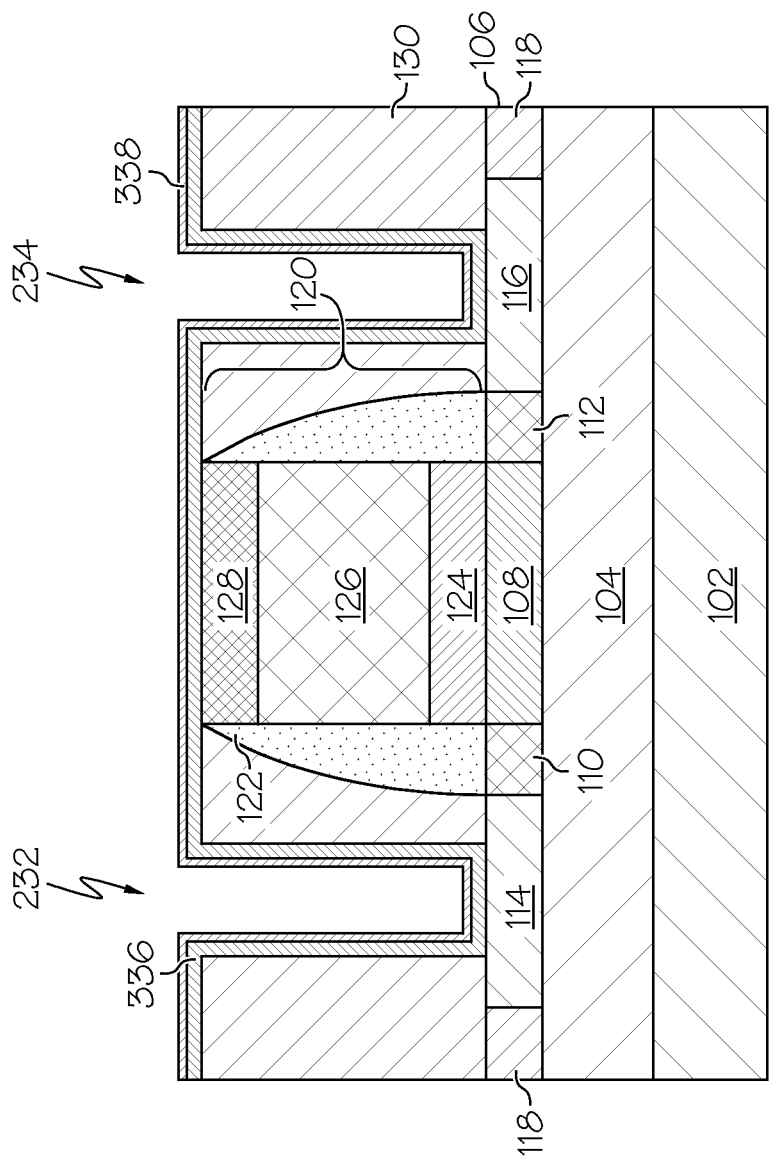
FIG. 3 is a cross-sectional view of the semiconductor structure after a semiconductor layer and a metallic layer have been formed in the contact regions according to one embodiment of the present invention.

A dielectric layer 130 (e.g., an oxide layer, nitride layer, low-k material or any suitable combination of those materials) is then formed over the entire structure, as shown in FIG. 1. Next, portions of the dielectric layer 130 over the source/drain regions 114, 116 are removed (e.g., through a dry etch such as RIE and/or a wet etch using HF) so as to create contact regions such as trenches/openings 232 and 234 exposing a portion of the source/drain regions 114, 116, as shown in FIG. 2. A semiconductor material is deposited and a contact trench semiconductor layer 336 is formed on the exposed portion of the source/drain regions 114, 116, inner sidewalls of the contact trenches 232, 234, and a top surface of the dielectric layer 130, as shown in FIG. 3. The contact trench semiconductor layer 336 can be formed by chemical vapor deposition (CVD), molecular beam epitaxy (MBE), physical vapor deposition (PVD), atomic layer deposition (ALD), or any combination thereof. The contact trench semiconductor layer 336 comprises any semiconducting material, including but not limited to Si, strained Si, SiC, Ge, SiGe, SiGeC, Si alloys, Ge alloys, GaAs, InAs, InP, GaSb, or any combination thereof, as well as other III/V or II/VI compound semiconductors and alloys thereof. The contact trench semiconductor layer 336 can be formed with a thickness ranging from, for example, 1-10 nm.

A metal/metallic material is deposited and a contact trench metallic layer 338 is formed on the contact trench semiconductor layer 336. For example, the contact trench metallic layer 338 is formed on the inner sidewalls of the contact trench semiconductor layer 336, a bottom (horizontal) portion of the contact trench semiconductor layer 336 (which is formed on the source/drain regions 114, 116), and a top surface of the contact trench semiconductor layer 336, as shown in FIG. 3. The contact trench metallic layer 338 can be formed by chemical vapor deposition (CVD), physical vapor deposition (PVD), atomic layer deposition (ALD), or any combination thereof. The contact trench metallic layer 338 comprises a metallic material, including but not limited to nickel (Ni), cobalt (Co), titanium (Ti), platinum (Pt), rare earth metals (e.g., Erbium (Er), Ytterbium (Yt), etc.), silicides (or germanides) of these materials, or an alloy or any combination thereof. The contact trench metallic layer 338 can be formed with a thickness ranging from, for example, 1-10 nm. It should be noted that, in one embodiment, the thickness of the metallic layer 338 can be adjusted such that the semiconductor layer 336 is consumed during the silicide reaction process provided subsequent thermal treatment.

It should be noted that in one embodiment, an optional thin layer (interlayer) of impurities (e.g., Sulfur (S), Selenium (Se), etc.), dopants (e.g., Boron (B), Arsenic (As), Phosphorous (P), Antimony (Sb), Gallium (Ga), Aluminum (Al), etc.), band edge materials (e.g., Pt, Er, Yb, Al, etc.) can be formed on the source/drain region 114, 116 of the top semiconductor layer 106 prior to forming the contact trench semiconductor layer 336. This optional thin layer modifies the Schottky barrier height (SBH) of the contact trench semiconductor layer 336 for reducing contact resistance.

Figure 4:
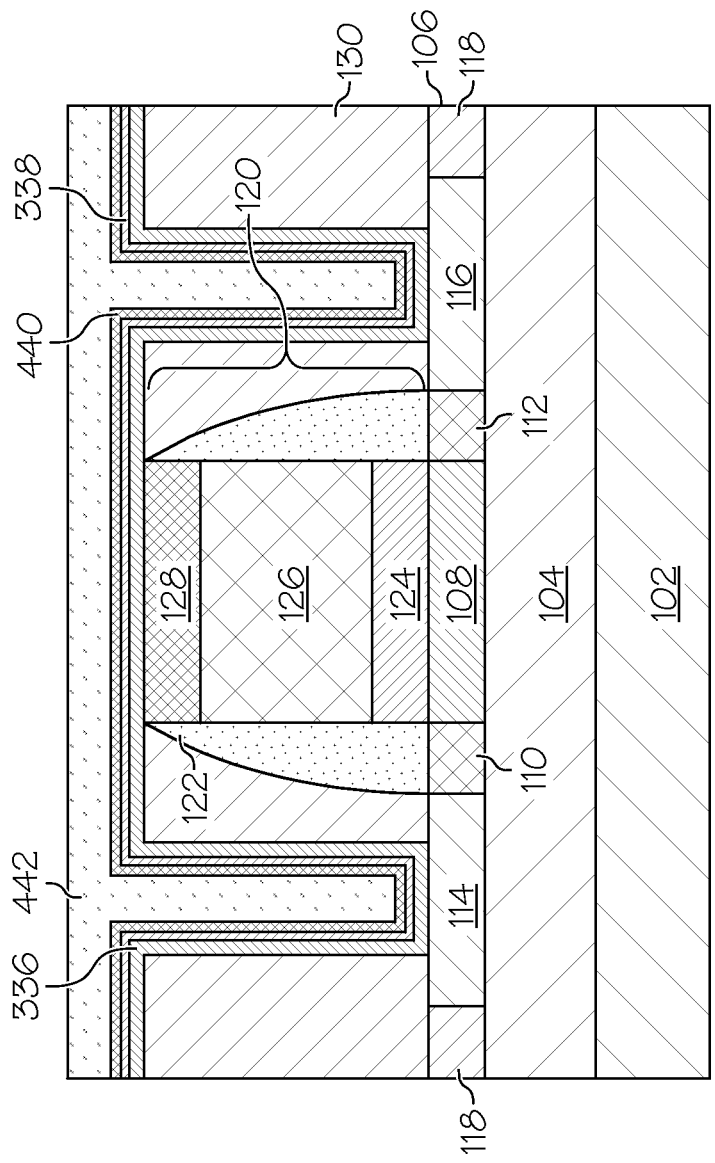
FIG. 4 is a cross-sectional view of the semiconductor structure after a conductive contact layer and conductive fill material layer and a metallic layer have been formed in the contact regions according to one embodiment of the present invention.

After the contact trench metallic layer 338 has been formed, an optional conductive contact liner 440 (e.g., a titanium nitride liner, tantalum nitride liner, etc.) is formed on the contact trench metallic layer 338. For example, the optional conductive contact liner 440 is formed on the inner sidewalls of the contact trench metallic layer 338, a bottom (horizontal) portion of the contact trench metallic layer 338 (which is formed on the bottom portion of the contact trench semiconductor layer 336), and a top surface of the contact trench metallic layer 338, as shown in FIG. 4. Then, a conductive fill material layer 442 (e.g., a metal, such as tungsten, copper, aluminum, or any other conventional contact material) is deposited in the remaining portion of the contact trenches 232, 234 until the contact trenches 232, 234 are filled, as shown in FIG. 4. The conductive fill material layer 442 is formed on the inner sidewalls of the conductive contact liner 440, a bottom (horizontal) portion of the conductive contact liner 440 (which is formed on the bottom portion of the contact trench metallic layer 338), and a top surface of the conductive contact liner 440, as shown in FIG. 4.

An anneal is then optionally performed to form silicide (germanide) resulting from the reaction of the contact trench metallic layer 338 with the contact trench semiconductor layer 336. It should be noted that this anneal can also be performed after the contact trench metallic layer 338 has been formed and prior to forming the conductive contact liner 440.

It should be noted that, in one embodiment, optional impurities (e.g., Sulfur (S), Selenium (Se), etc.), dopants (e.g., Boron (B), Arsenic (As), Phosphorous (P), Antimony (Sb), Gallium (Ga), Aluminum (Al), etc.), band edge materials (e.g., Pt, Er, Yb, Al, etc.) are supplied on the metallic layer 338 or the formed silicide (germanide), e.g. by ion implantation or other deposition methods. The impurities can be thermally diffused to the silicide (germanide) substrate interface to reduce contact resistance.

Figure 5:
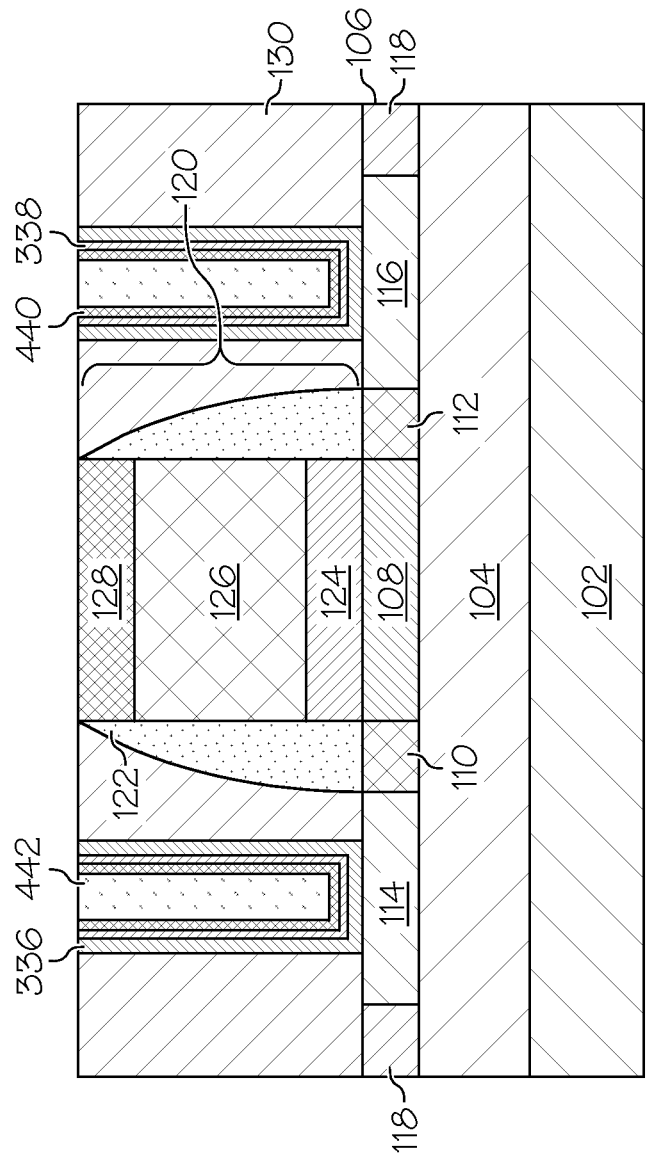
FIG. 5 is a cross-sectional view of the semiconductor structure after a planarization process has been performed on the structure shown in FIG. 4 according to one embodiment of the present invention.

The contact trench semiconductor layer 336, contact trench metallic layer 338, conductive contact liner 440, and conductive fill material layer 442 are then planarized utilizing any conventional process such as, but not limited to, chemical mechanical polishing (CMP) or RIE, where the dielectric layer 130 is used as a stop layer. The resulting structure is shown in FIG. 5. Conventional processes are the performed to complete the fabrication process.

Figure 6:
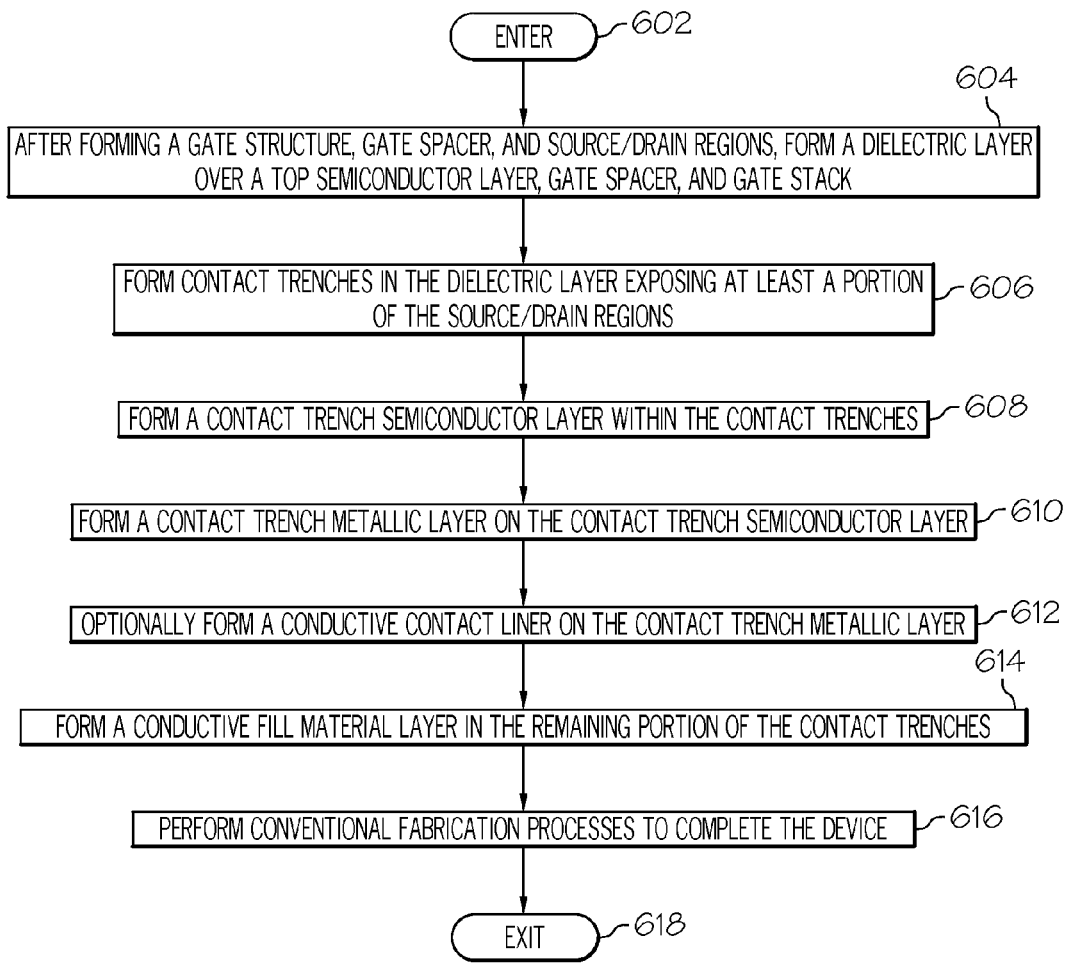
FIG. 6 is an operational flow diagram illustrating one process for forming silicide contacts according to one embodiment of the present invention.

FIG. 6 is an operational flow diagram illustrating one process for forming silicide contacts according to one embodiment of the present invention. In FIG. 6, the operational flow diagram begins at step 602 and flows directly to step 604. It should be noted that each of the steps shown in FIG. 6 has been discussed in greater detail above with respect to FIGS. 1-5. After a gate structure 120, gate spacer 122, and source/drain regions 114, 116 are formed, a dielectric layer 130, at step 604, is formed over a top semiconductor layer 106, the gate spacer 122, and the gate structure 120. Contact trenches 232, 234, at step 606, are formed in the dielectric layer 130 so as to expose at least a portion of the source/drain regions 114, 116.

A contact trench semiconductor layer 336, at step 608, is formed within the contact trenches 232, 234. A contact trench metallic layer 338, at step 610, is formed on the contact trench semiconductor layer 336. An optional conductive contact liner 440, at step 612 is formed on the contact trench metallic layer 338. A conductive fill material layer 442, at step 614, is formed in the remaining portion of the contact trenches 232, 234. Conventional fabrication processes, at step 616, are performed to complete the device. The control flow then exits at step 618.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product or electronic device that includes integrated circuit chips, ranging from toys and other low-end applications to advanced computer products having a display, a keyboard, or other input device, and a central processor.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A transistor comprising:
   a dielectric layer formed on a first semiconductor layer, a gate spacer, and a gate stack, wherein the gate spacer and gate stack are formed on the first semiconductor layer, and wherein the dielectric layer extends at least to a top surface of the gate stack, wherein the first semiconductor layer is planar and a bottom portion of the gate stack is formed in contact with a top surface of the first semiconductor layer;
   source/drain regions formed within the first semiconductor layer, where the source/drain regions are adjacent to and in contact with shallow trench isolation structures, and wherein a top surface of the source/drain regions and the top surface of the first semiconductor layer are coplanar;
   source/drain extensions formed beneath the gate spacer, and adjacent to and in contact with the source/drain regions, respectively, where a top surface the source/drain extensions is planar with a top surface of the shallow trench isolation structures and a top surface of the source/drain regions;
   a first contact trench and a second contact trench formed on and above at least a portion of the source/drain regions, respectively, wherein the dielectric layer comprises vertical sidewalls within each of the first contact trench and the second contact trench;
   wherein each of the first contact trench and second contact trench comprises:
      a second semiconductor layer conformally formed within each of the first contact trench and the second contact trench, wherein the second semiconductor layer comprises a single layer of semiconductor material, and wherein a bottom portion of the second semiconductor layer is formed in contact with exposed portions of the first semiconductor layer comprising the source/drain regions, respectively, and wherein the second semiconductor layer comprises vertical sidewalls conformally formed in contact with the vertical sidewalls of the dielectric layer in their entirety within the respective first contact trench and a second contact trench, wherein the bottom portion and vertical sidewalls of the second semiconductor layer comprise the same semiconductor material;
      a metallic layer formed in contact with and conformal to the second semiconductor layer;
      a conductive contact liner formed in contact with and conformal to the metallic layer;
      a conductive contact layer formed in contact with and conformal to the conductive contact liner and filling a space between inner vertical sidewalls of the conductive contact liner; and
      one of a silicide region and a germanide region formed from the second semiconductor layer and the metallic layer and formed between the metallic layer and the conductive contact liner.

2. The transistor of claim 1, wherein each of the first contact trench and second contact trench further comprises:
   an interlayer formed within on the portion of the source/drain regions.

3. The transistor of claim 2, wherein the interlayer comprises at least one of impurities, dopants, and band edge materials.

4. The transistor of claim 1, wherein the second semiconductor layer comprises at least one of:
   silicon;
   strained silicon;
   silicon carbide;
   germanium;
   silicon germanium;
   silicon-germanium-carbon;
   silicon alloys;
   germanium alloys;
   gallium arsenide;
   indium arsenide;

indium phosphide;
group III/V compound semiconductors; and
group II/VI compound semiconductors.

5. The transistor of claim 1, wherein the metallic layer comprises at least one of:
nickel;
cobalt;
titanium;
platinum; and
rare earth metals.

6. An integrated circuit comprising:
a transistor, wherein the transistor comprises:
a dielectric layer formed on a first semiconductor layer, a gate spacer, and a gate stack, wherein the gate spacer and gate stack are formed on the first semiconductor layer; and wherein the dielectric layer extends at least to a top surface of the gate stack, wherein the first semiconductor layer is planar and a bottom portion of the gate stack is formed in contact with a top surface of the first semiconductor layer;
source/drain regions formed within the first semiconductor layer, where the source/drain regions are adjacent to and in contact with shallow trench isolation structures, and wherein a top surface of the source/drain regions and the top surface of the first semiconductor layer are coplanar;
source/drain extensions formed beneath the gate spacer, and adjacent to and in contact with the source/drain regions, respectively, where a top surface the source/drain extensions is planar with a top surface of the shallow trench isolation structures and a top surface of the source/drain regions;
a first contact trench and a second contact trench formed on and above at least a portion of source/drain regions, respectively, wherein the dielectric layer comprises vertical sidewalls within each of the first contact trench and the second contact trench;
wherein each of the first contact trench and second contact trench comprises:
a second semiconductor layer conformally formed within each of the first contact trench and the second contact trench, wherein the second semiconductor layer comprises a single layer of semiconductor material, and wherein a bottom portion of the second semiconductor layer is formed in contact with exposed portions of the first semiconductor layer comprising the source/drain regions, respectively, and wherein the second semiconductor layer comprises vertical sidewalls conformally formed in contact with the vertical sidewalls of the dielectric layer in their entirety within the respective first contact trench and a second contact trench, wherein the bottom portion and vertical sidewalls of the second semiconductor layer comprise the same semiconductor material;
a metallic layer formed in contact with and conformal to the second semiconductor layer; a conductive contact liner formed in contact with and conformal to the metallic layer;
a conductive contact layer formed in contact with and conformal to the conductive contact liner and filling a space between inner vertical sidewalls of the conductive contact liner; and
one of a silicide region and a germanide region formed from the second semiconductor layer and the metallic layer and formed between the metallic layer and the conductive contact liner.

7. The integrated circuit of claim 6, wherein each of the first contact trench and second contact trench further comprises:
an interlayer formed within on the portion of the source/drain regions.

8. The integrated circuit of claim 7, wherein the interlayer comprises at least one of impurities, dopants, and band edge materials.

9. The integrated circuit of claim 6, wherein the second semiconductor layer comprises at least one of:
silicon;
strained silicon;
silicon carbide;
geranium;
silicon germanium;
silicon-germanium-carbon;
silicon alloys;
germanium alloys;
gallium arsenide;
indium arsenide;
indium phosphide;
group III/V compound semiconductors; and
group II/VI compound semiconductors.

10. The integrated circuit of claim 6, wherein the metallic layer comprises at least one of:
nickel;
cobalt;
titanium;
platinum; and
rare earth metals.

11. An electronic device comprising:
an integrated circuit comprising a first semiconductor layer, the integrated circuit further comprising:
a transistor, wherein the transistor comprises:
a dielectric layer formed on a first semiconductor layer, a gate spacer, and a gate stack, wherein the gate spacer and gate stack are formed on the first semiconductor layer; and wherein the dielectric layer extends at least to a top surface of the gate stack, wherein the first semiconductor layer is planar and a bottom portion of the gate stack is formed in contact with a top surface of the first semiconductor layer;
source/drain regions formed within the first semiconductor layer, where the source/drain regions are adjacent to and in contact with shallow trench isolation structures, and wherein a top surface of the source/drain regions and the top surface of the first semiconductor layer are co-planar;
source/drain extensions formed beneath the gate spacer, and adjacent to and in contact with the source/drain regions, respectively, where a top surface the source/drain extensions is planar with a top surface of the shallow trench isolation structures and a top surface of the source/drain regions;
a first contact trench and a second contact trench formed on and above at least a portion of the source/drain regions, respectively, wherein the dielectric layer comprises vertical sidewalls within each of the first contact trench and the second contact trench;
wherein each of the first contact trench and second contact trench comprises:
a second semiconductor layer conformally formed within each of the first contact trench and the second contact trench, wherein the second semiconductor layer comprises a single layer of semiconductor material, and wherein a bottom portion of the second semiconductor layer is formed in contact with exposed portions of the first semiconductor layer comprising the source/drain regions, respectively, and wherein the second semiconductor layer comprises vertical sidewalls conformally formed in contact with the vertical sidewalls of the dielectric layer in their entirety within the respective first contact trench and a second contact trench, wherein the bottom portion and vertical sidewalls of the second semiconductor layer comprise the same semiconductor material;

a metallic layer formed in contact with and conformal to the second semiconductor layer;

a conductive contact liner formed in contact with and conformal to the metallic layer;

a conductive contact layer formed in contact with and conformal to the conductive contact liner and filling a space between inner vertical sidewalls of the conductive contact liner; and one of a silicide region and a germanide region formed from the second semiconductor layer and the metallic layer and formed between the metallic layer and the conductive contact liner.

12. The electronic device of claim 11, wherein each of the first contact trench and second contact trench further comprises:

an interlayer formed within on the portion of the source/drain regions.

13. The electronic device of claim 12, wherein the interlayer comprises at least one of impurities, dopants, and band edge materials.

* * * * *